(12) United States Patent
Jeong et al.

(10) Patent No.: US 10,170,472 B2
(45) Date of Patent: Jan. 1, 2019

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Lak Gyo Jeong, Ansan-si (KR); Yong Rae Cho, Anyang-si (KR); Kyo Wook Lee, Goyang-si (KR); Hee Bum Hong, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/632,815

(22) Filed: Jun. 26, 2017

(65) Prior Publication Data

US 2018/0040616 A1 Feb. 8, 2018

(30) Foreign Application Priority Data

Aug. 3, 2016 (KR) .................. 10-2016-0098870

(51) Int. Cl.
*H01L 27/088* (2006.01)
*H01L 27/11* (2006.01)
*H01L 27/02* (2006.01)
*G11C 8/16* (2006.01)
*G11C 11/412* (2006.01)

(52) U.S. Cl.
CPC ...... *H01L 27/0886* (2013.01); *H01L 27/0207* (2013.01); *H01L 27/1104* (2013.01); *G11C 8/16* (2013.01); *G11C 11/412* (2013.01)

(58) Field of Classification Search
CPC ............ H01L 27/0886; H01L 27/1104; H01L 27/0207
See application file for complete search history.

(56) References Cited

U.S. PATENT DOCUMENTS

| | | | |
|---|---|---|---|
| 6,717,842 B2 | 4/2004 | Watanabe et al. |
| 7,038,926 B2 | 5/2006 | Jeong et al. |
| 7,385,864 B2 | 6/2008 | Loh et al. |
| 7,405,994 B2 | 7/2008 | Liaw |
| 7,848,172 B2 | 12/2010 | Dudeck et al. |
| 7,894,280 B2 | 2/2011 | Houston |
| 7,965,564 B2 | 6/2011 | Lavi et al. |
| 8,183,639 B2 | 5/2012 | Malinge et al. |
| 8,261,138 B2 | 9/2012 | Chang et al. |
| 8,315,084 B2 | 11/2012 | Liaw et al. |
| 8,339,876 B2 | 12/2012 | Chandra et al. |

(Continued)

*Primary Examiner* — Walter H Swanson
(74) *Attorney, Agent, or Firm* — Myers Bigel, P.A.

(57) ABSTRACT

A semiconductor device includes a substrate first through fourth active fins on the substrate, extending in a first direction, and spaced apart from one another in a second direction that intersects the first direction, a first gate electrode extending in the second direction and on the first active fin to overlap with the first active fin but not with the second through fourth active fins, a second gate electrode extending in the second direction and on the second and third active fins to overlap with the second active fin but not with the first and fourth active fins, a first contact on the first gate electrode and connected to a first wordline, and a second contact on the second gate electrode and connected to a second wordline. The first through third active fins are between the first and second contacts. Related devices are also discussed.

20 Claims, 18 Drawing Sheets

(56) References Cited

U.S. PATENT DOCUMENTS

| | | | |
|---|---|---|---|
| 8,409,956 B1 * | 4/2013 | Kang | H01L 21/82347 |
| | | | 257/E21.578 |
| 8,555,119 B2 | 10/2013 | Chang et al. | |
| 8,934,287 B2 | 1/2015 | Liaw | |
| 2012/0120703 A1 | 5/2012 | Chang et al. | |
| 2015/0255462 A1 * | 9/2015 | Liaw | G11C 11/412 |
| | | | 257/369 |
| 2016/0064387 A1 * | 3/2016 | Jeong | H01L 27/1104 |
| | | | 257/401 |
| 2016/0111506 A1 * | 4/2016 | Lee | H01L 29/41775 |
| | | | 257/401 |
| 2017/0323894 A1 * | 11/2017 | Yeh | H01L 27/1104 |

* cited by examiner

SEMICONDUCTOR DEVICE AND METHOD OF FABRICATING THE SAME

CLAIM OF PRIORITY

This application claims priority to Korean Patent Application No. 10-2016-0098870, filed on Aug. 3, 2016, and all the benefits accruing therefrom under 35 U.S.C. § 119, the disclosure of which is incorporated herein by reference in its entirety.

BACKGROUND

The present disclosure relates to semiconductor devices and methods of fabricating the same.

Semiconductor devices have increasingly become miniaturized and multi-functionalized. Accordingly, various processes of fabricating semiconductor devices have been developed to increase the integration density of semiconductor devices. Also, the use of static random access memories (SRAMs) has been widespread because of SRAMs' high access speed. Also, the scale of semiconductor processing has increasingly decreased in accordance with the miniaturization of semiconductor devices.

SUMMARY

Example embodiments of the present disclosure provide semiconductor devices and methods of fabricating the same, which can improve the yield of a semiconductor device based on the arrangement of wordline contacts and active fins.

Example embodiments of the present disclosure also provide semiconductor devices and methods of fabricating the same, which can secure a process margin and improve the yield of a semiconductor device based on the arrangement of metal wires.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to an example embodiment of the present disclosure, there is provided a semiconductor device, comprising a substrate, first through fourth active fins formed on the substrate, extending in a first direction, and spaced apart from one another in a second direction, which intersects the first direction, a first gate electrode extending in the second direction and formed on the first active fin to overlap with the first active fin, but not with the second through fourth active fins, a second gate electrode extending in the second direction and formed on the second and third active fins to overlap with the second and third active fins, but not with the first and fourth active fins, a third gate electrode extending in the second direction and formed on the first through fourth active fins to be spaced apart from the first and second gate electrodes in the first direction and to overlap with the first through fourth active fins, a first contact formed on the first gate electrode and connected to a first wordline and a second contact formed on the second gate electrode and connected to a second wordline, wherein the third active fin is formed between the first and second active fin and the fourth active fin, the length of the first and second active fins in the first direction is larger than the length of the third and fourth active fins in the first direction, and the first through third active fins are formed between the first and second contacts.

According to some embodiments of the present inventive concepts, there is provided a semiconductor device, comprising a substrate, first through fourth active fins formed on the substrate, extending in a first direction, and spaced apart from one another in a second direction, which intersects the first direction, a first gate electrode extending in the second direction and formed on the first active fin to overlap with the first active fin, but not with the second through fourth active fins, a second gate electrode extending in the second direction and formed on the second and third active fins to overlap with the second active fin, but not with the first and fourth active fins, a first contact formed on the first gate electrode and connected to a first wordline and a second contact formed on the second gate electrode and connected to a second wordline, wherein the first through third active fins are formed between the first and second contacts.

According to some embodiments of the present inventive concepts, an integrated circuit device includes a substrate having adjacent first and second substrate regions, and active fins protruding from the substrate in the first and second substrate regions and extending parallel to one another in a first direction. First and second gate electrodes extend co-linearly in a second direction that intersects the first direction. The first and second gate electrodes are electrically isolated and extend on first and second active fins of the active fins in the first substrate region to define first and second transistors, respectively. First and second wordlines extend in parallel on the first and second substrate regions, and first and second wordline contacts connect the first and second gate electrodes to the first and second wordlines, respectively. The active fins in the first substrate region are between the first and second wordline contacts.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION

A semiconductor device according to some example embodiments of the present disclosure will hereinafter be described with reference to FIGS. 1 through 8.

Figure 1:
FIG. 1 is a conceptual view of a semiconductor device according to some example embodiments of the present disclosure.
Figure 2:
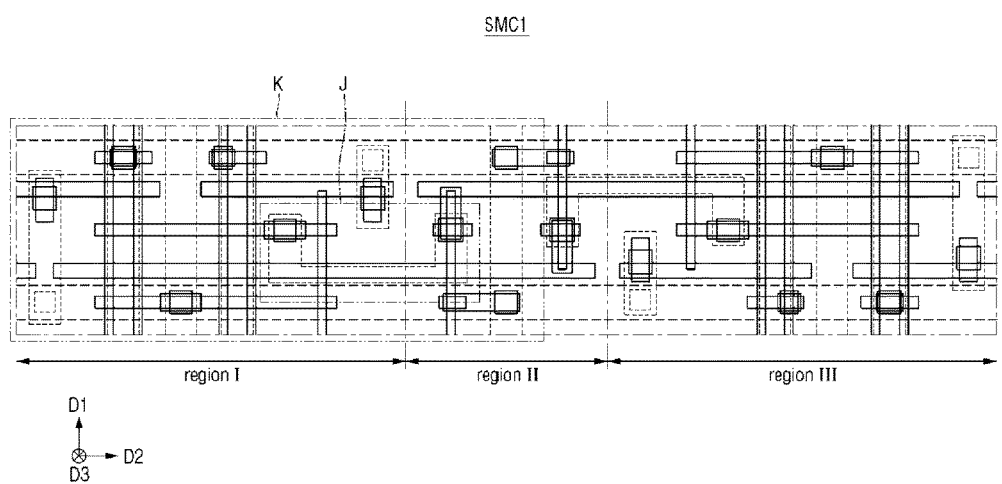
FIG. 2 is a layout view of a first static random access memory (SRAM) cell of FIG. 1.
Figure 3:
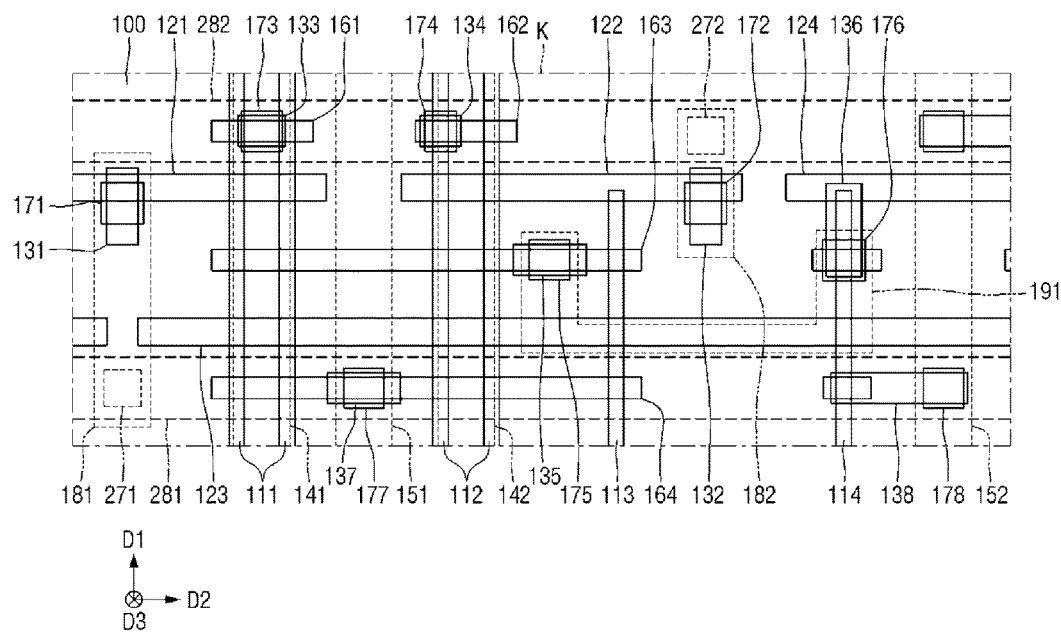
FIG. 3 is an enlarged view of an area K of FIG. 2.
Figure 4:
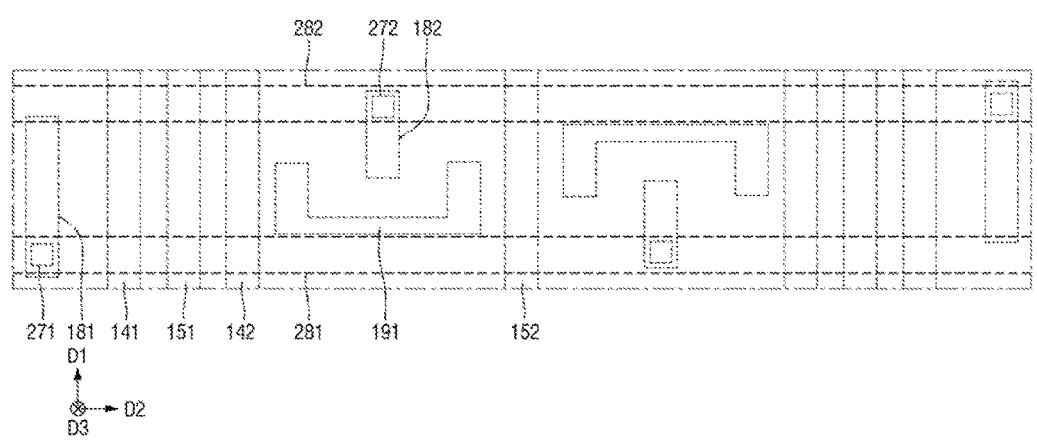
FIG. 4 is a layout view illustrating first through fifth metal wires, first and second bitlines, and first and second wordlines of FIG. 2.
Figure 5:
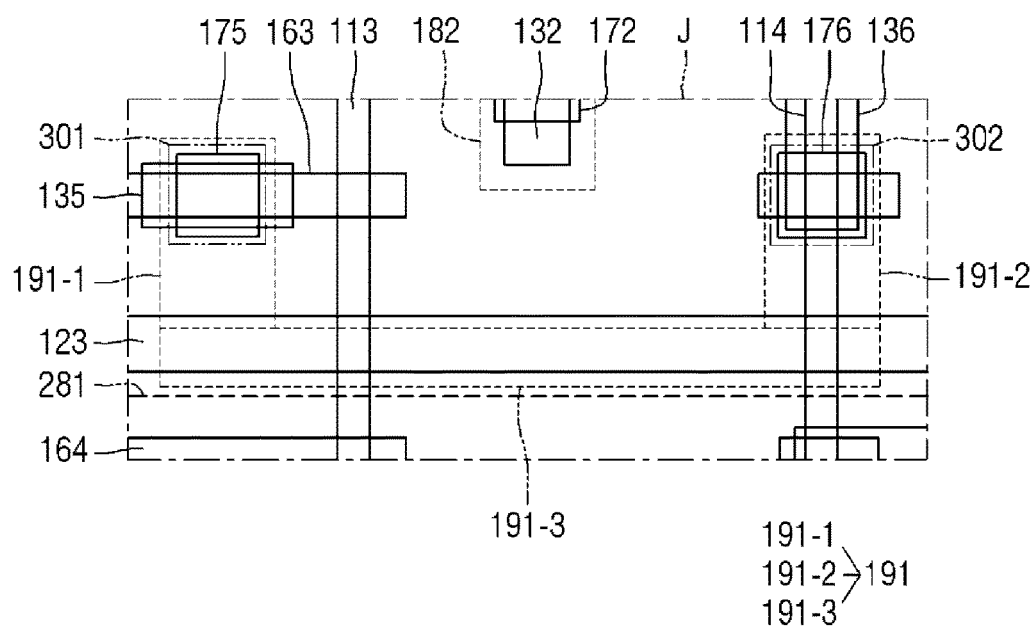
FIG. 5 is an enlarged view of an area J of FIG. 2.
Figure 6:
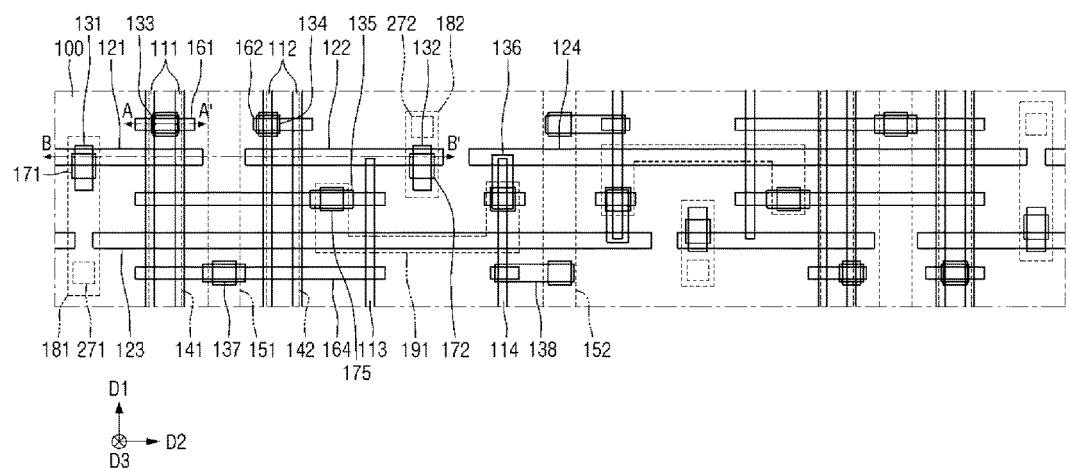
FIG. 6 is a layout view illustrating all the elements of FIG. 2 except for the first and second wordlines.
Figure 7:
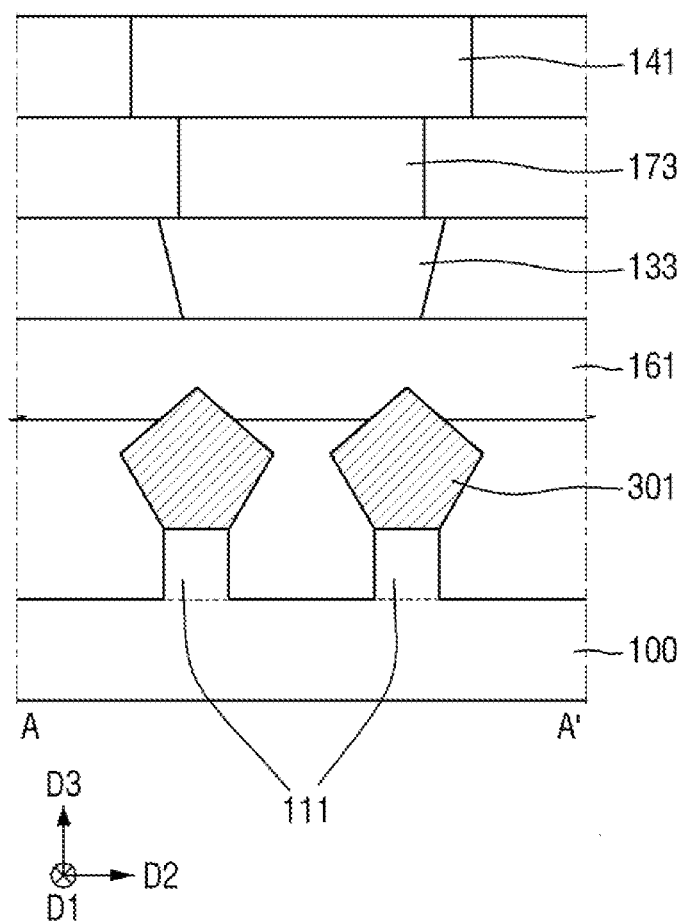
FIG. 7 is a cross-sectional view taken along line A-A' of FIG. 6.
Figure 8:
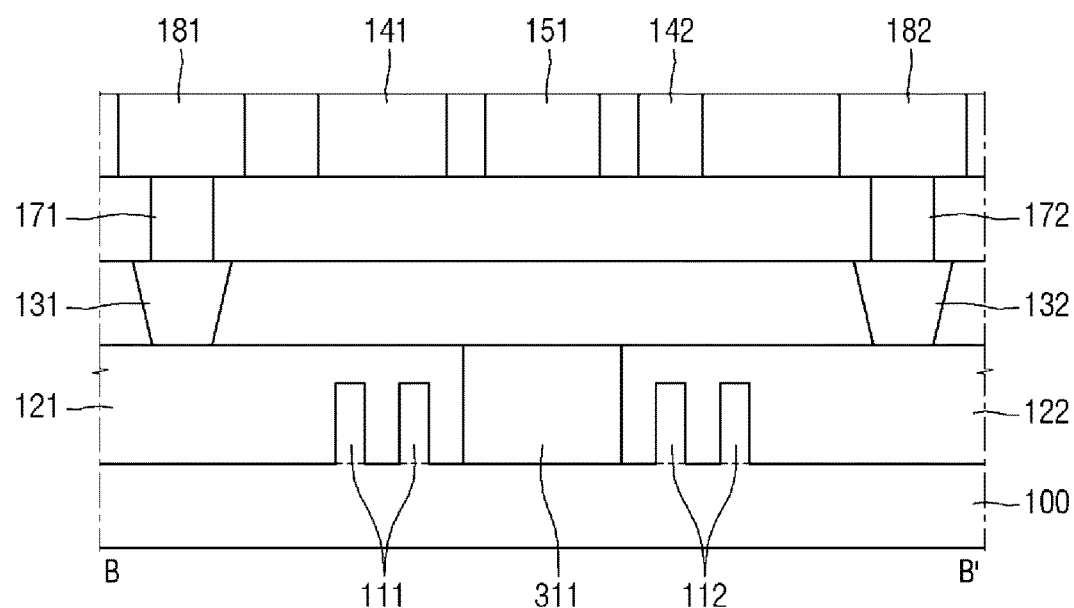
FIG. 8 is a cross-sectional view taken along line B-B' of FIG. 6.
Figure 8:
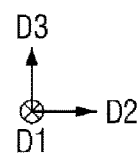

FIG. 1 is a conceptual view of a semiconductor device according to some example embodiments of the present disclosure. FIG. 2 is a layout view of a first static random access memory (SRAM) cell of FIG. 1. FIG. 3 is an enlarged view of an area K of FIG. 2. FIG. 4 is a layout view illustrating a first metal wire 181, a second metal wire 182, a third metal wire 151, a fourth metal wire 152, a fifth metal wire 191, a first bitline 141, a second bitline 142, a first wordline 281, and a second wordline 282 only among other elements of FIG. 2. FIG. 5 is an enlarged view of an area J of FIG. 2. FIG. 6 is a layout view illustrating all the elements of FIG. 2 except for the first and second wordlines 281 and 282. FIG. 7 is a cross-sectional view taken along line A-A' of FIG. 6. FIG. 8 is a cross-sectional view taken along line B-B' of FIG. 6.

For clarity, the illustration of some elements such as an interlayer dielectric layer is omitted in FIGS. 1 through 8. Also, embodiments of the present disclosure will hereinafter be described, taking, as an example, a semiconductor device in which an SRAM device is disposed in each memory cell array region MR, but the present disclosure is not limited thereto. Also, embodiments of the present disclosure will hereinafter be described, taking, as an example, a semiconductor device in which an 8T SRAM device including eight transistors is disposed in each memory cell array region MR, but the present disclosure is not limited thereto.

Referring to FIG. 1, a plurality of SRAM memory cell regions SMC1, SMC2, SMC3, and SMC4 may be disposed in a memory cell array region MR. The SRAM memory cell regions SMC1, SMC2, SMC3, and SMC4 may be arranged in the form of a matrix array, as illustrated in FIG. 1.

Referring to FIGS. 2 and 3, a substrate 100 may include a first region "region I", a second region "region II", and a third region "region III".

The first region "region I", the second region "region II", and the third region "region III" of the substrate 100 may be formed to be adjacent to one another. The second region "region II" may be, for example, a region disposed between the first and third regions "region I" and "region III". In some example embodiments, the first and third regions "region I" and "region III" may be, but are not limited to, n-type metal oxide semiconductor (NMOS) regions, and the second region "region II" may be, but is not limited to, a p-type metal oxide semiconductor (PMOS) region.

The first and third regions "region I" and "region III" of the substrate 100 may have the same elements, but the direction of the arrangement of the elements of the first region "region I" and the direction of the arrangement of the elements of the third region "region III" may differ from each other (e.g., may be rotated) by 180 degrees.

The substrate 100 may be, for example, a bulk silicon substrate or a silicon-on-insulator (SOI) substrate. Alternatively, the substrate 100 may be a silicon substrate or may comprise a material such as silicon germanium, indium antimonide, lead telluride, indium arsenide, indium phosphide, gallium arsenide, or gallium antimonide. Alternatively, the substrate 100 may be a base substrate with an epitaxial layer formed thereon.

First through fourth fin-shaped active regions (referred to herein as active fins) 111 through 114 may be formed on the substrate 100 to extend in a first direction D1. The first through fourth active fins 111 through 114 may protrude from the top surface of the substrate 100. The first through fourth active fins 111 through 114 may be formed to be spaced apart from one another in a second direction D2.

The first and second directions D1 and D2 are illustrated as forming a right angle with each other, but the present disclosure is not limited thereto. For example, the second direction D2 may be any direction intersecting the first direction D1. In another example, the first and second directions D1 and D2 may form an acute angle with each other.

The term "on," when used to designate that an element/layer is on another element or located on a different layer, includes both a case where an element is located directly on another element or layer, and a case where an element is located on another element via another layer or still another element (e.g., a case where intervening element(s) or layer(s) are present).

The third active fin 113 may be formed between the first and second active fin 111 and 112 and the fourth active fin 114. The length of the first and second active fins 111 and 112 may differ from the length of the third and fourth active fins 113 and 114, which will be described later in detail.

In some example embodiments, the first through third active fins 111 through 113 may be formed in the first region "region I" of the substrate 100, and the fourth active fin 114 may be formed in the second region "region II" of the substrate 100. Each of the first and second active fins 111 and 112 may include, for example, a plurality of active fins.

The first through fourth active fins 111 through 114 may comprise a single element semiconductor material such as silicon (Si) or germanium (Ge). Alternatively, the first through fourth active fins 111 through 114 may comprise a compound semiconductor such as, for example, a IV-IV group compound semiconductor or a III-V group compound semiconductor.

The IV-IV group compound semiconductor may be, for example, a binary or ternary compound comprising at least two of carbon (C), Si, Ge, and/or tin (Sn), or a compound obtained by doping the binary or ternary compound with a IV group element.

The group III-V compound semiconductor, for example, may be one of a binary compound, a ternary compound, and a quaternary compound, each of which is formed by bonding at least one group III element (such as aluminum (Al), gallium (Ga), and/or indium (In)) with at least one group V element (such as phosphorus (P), arsenic (As), and/or antimony (Sb)).

A field insulating layer may be formed on the substrate 100 to at least partially cover the sides of the first through fourth active fins 111 through 114.

The field insulating layer may be formed of, for example, a material comprising at least one of a silicon oxide layer, a silicon nitride layer, or a silicon oxynitride layer.

A first gate electrode 121 may extend in the second direction D2. The first gate electrode 121 may be formed on the first active fin 111 to overlap with the first active fin 111. The first gate electrode 121 may not overlap with the second through fourth active fins 112 through 114.

A second gate electrode 122 may extend in the second direction D2. The second gate electrode 122 may be formed on the second and third active fins 112 and 113 to overlap with the second and third active fins 112 and 113, but not with the first and fourth active fins 111 and 114, but the present disclosure is not limited thereto.

Alternatively, the second gate electrode 122 may be formed on the second active fin 112 to overlap with the second active fin 112, but the second gate electrode 122 may not overlap with the third active fin 113. The second gate electrode 122 may be aligned or extend co-linear with the first gate electrode 121 along the second direction D2.

The third gate electrode 123 may extend in the second direction D2. The third gate electrode 123 may be formed on the first through fourth active fins 111 through 114 to overlap with the first through fourth active fins 111 through 114. The third gate electrode 123 may be formed to be spaced apart from the first and second gate electrodes 121 and 122 in the first direction D1.

The fourth gate electrode 124 may extend in the second direction D2. The fourth gate electrode 124 may be formed on the fourth active fin 114 to overlap with the fourth active fin 114, but the present disclosure is not limited thereto. For example, the fourth gate electrode 124 may be formed to not overlap with the fourth active fin 114.

The fourth gate electrode 124 may be formed to not overlap with the first through third active fins 111 through 113. The fourth gate electrode 124 may be spaced apart from the first and second gate electrodes 121 and 122 in the second direction D2 and may be spaced apart from the third gate electrode 123 in the first direction D1.

The first through fourth gate electrodes 121 through 124 may comprise a conductive material. Each of the first through fourth gate electrodes 121 through 124 is illustrated as being a single layer, but the present disclosure is not limited thereto. For example, each of the first through fourth gate electrodes 121 through 124 may include a work function conductive layer adjusting a work function and a filling conductive layer filling a space formed by the work function conductive layer.

The first through fourth gate electrodes 121 through 124 may comprise, for example, at least one of TiN, WN, TaN, Ru, TiC, TaC, Ti, Ag, Al, TiAl, TiAlN, TiAlC, TaCN, TaSiN, Mn, Zr, W, or Al. Alternatively, the first through fourth gate electrodes 121 through 124 may comprise a non-metal material such as, for example, Si or SiGe. The first through fourth gate electrodes 121 through 124 may be formed by, for example, a replacement process, but the present disclosure is not limited thereto.

For convenience, the illustration of some elements such as a gate insulating layer and spacers is omitted in FIGS. 1 through 8.

The first through fourth active fins 111 through 114 and the first through fourth gate electrodes 121 through 124 may be formed in one layer that overlaps, in a third direction D3, with the other layer in which the first and second bitlines 141 and 142, first, second, third, fourth, and fifth metal wires 181, 182, 151, 152, and 191, and the first and second wordlines 281 and 282 are formed.

The third direction D3 may be a direction intersecting the first and second directions D1 and D2. For example, the third direction D3 may be a direction perpendicular to the top surface of the substrate 100.

For example, the first and second bitlines 141 and 142, the first, second, third, fourth, and fifth metal wires 181, 182, 151, 152, and 191, and the first and second wordlines 281 and 282 may be formed on the first through fourth active fins 111 through 114 and the first through fourth gate electrodes 121 through 124.

One layer in which the first through fourth active fins 111 through 114, the first through fourth gate electrodes 121 through 124, and the other layer in which the first and second bitlines 141 and 142, the first, second, third, fourth, and fifth metal wires 181, 182, 151, 152, and 191, and the first and second wordlines 281 and 282 may be connected by silicides, contacts, and/or vias that will be described later. As used herein, the terms "connected" or "connecting" may refer to electrical connections between the recited elements, and as such, may or may not require direct contact between the recited elements (as intervening connecting elements may be present).

Referring to FIGS. 2 through 4, first through fourth silicides 161 through 164 may be formed on the substrate 100 to extend in the second direction D2.

The first silicide 161 may be formed on the first active fin 111 to not overlap with the first gate electrode 121. In a case in which the first active fin 111 includes a plurality of active fins, the plurality of active fins of the first active fin 111 may be connected by the first silicide 161.

The second silicide 162 may be formed on the second active fin 112 to not overlap with the second gate electrode 122. In a case in which the second active fin 112 includes a plurality of active fins, the plurality of active fins of the second active fin 112 may be connected by the second silicide 162.

The third silicide 163 may be formed on the first through third active fins 111 through 113 to not overlap with the first through fourth gate electrodes 121 through 124. The first through third active fins 111 through 113 may be connected by the third silicide 163.

The fourth silicide 164 may be formed on the first through third active fins 111 through 113 to be spaced apart from the third silicide 163 in the first direction D1. The fourth silicide 164 may be formed to not overlap with the first through fourth gate electrodes 121 through 124.

The first through fourth silicides 161 through 164 may be formed to extend in the second direction D2.

The first through fourth silicides 161 through 164 are illustrated as electrically connecting a plurality of active fins, i.e., the first through fourth active fins 111 through 114, but the present disclosure is not limited thereto. For example, the first through fourth active fins 111 through 114 may be electrically connected by contacts, instead of the first through fourth silicides 161 through 164. In other words, at least one of the first through fourth silicides 161 through 164 may be replaced with one or more contacts, in which case, the first through fourth fins 111 through 114 may be electrically connected by the contacts.

A first contact 131 may be formed on the first gate electrode 121. A second contact 132 may be formed on the second gate electrode 122.

The first contact 131 may be formed on one side of the first active fin 111. The second contact 132 may be formed on the other side of the second active fin 112.

The first and second contacts 131 and 132 may be spaced apart from each other in the second direction D2. The first contact 131 is illustrated as, but is not limited to, not overlapping with the first active fin 111, and the second contact 132 is illustrated as, but is not limited to, not overlapping with the second and third active fins 112 and 113. That is, alternatively, the first and second contacts 131 and 132 may be formed to overlap with at least some active fins in the third direction D3.

The first contact 131 may provide a first wordline signal to the first wordline 281. The second contact 132 may provide a second wordline signal to the second wordline 282.

In some example embodiments, each of the first and second contacts 131 and 132 may be formed in a rectangular shape extending in the first direction D1, but the present disclosure is not limited thereto. For example, the first and second contacts 131 and 132 may be formed in various shapes other than a rectangular shape.

In some example embodiments, the first through third active fins 111 through 113 may be formed between the first and second contacts 131 and 132. By forming the first through third active fins 111 through 113 between the first and second contacts 131 and 132, a space margin can be secured between a wordline contact (for example, the first contact 131) and node contacts 135 and 136. Also, by securing an appropriate space margin, the yield of a semiconductor device can be improved.

A third contact 133 may be formed on the first active fin 111. The first silicide 161 may be formed between the third contact 133 and the first active fin 111. The third contact 133 may electrically connect the first bitline 141 and the first active fin 111.

A fourth contact 134 may be formed on the second active fin 112. The second silicide 162 may be formed between the fourth contact 134 and the second active fin 112. The fourth contact 134 may electrically connect the second bitline 142 and the second active fin 112.

A fifth contact 135 may be formed on the third silicide 163. A sixth contact 136 may be formed on the fourth active fin 114. A silicide may be formed between the fourth active fin 114 and the sixth contact 136. In some example embodiments, the fifth and sixth contacts 135 and 136 may be connected by the fifth metal wire 191, which will be described later in detail.

A seventh contact 137 may be formed on the fourth silicide 164. An eighth contact 138 may be formed on the fourth active fin 114. A silicide may be formed between the fourth fin 114 and the eighth contact 138. The seventh contact 137 may electrically connect the third metal wire 151 and the other side of a first pull-down transistor (PD1 of FIG. 9), which will be described later in detail.

The third through eighth contacts 133 through 138 are illustrated as being in a rectangular or square shape, but the present disclosure is not limited thereto. For example, the third through eighth contacts 133 through 138 may be formed in various shapes other than a rectangular or square shape.

The first metal wire 181 may be connected to the first contact 131 via a first via 171. That is, the first metal wire 181 may be connected to the first gate electrode 121 via the first contact 131 and the first via 171. The first metal wire 181 may be formed on the first contact 131. The first metal wire 181 may be electrically connected to the first wordline 281 which will be described later in detail and may provide a first wordline signal to the first contact 131.

The second metal wire 182 may be connected to the second contact 132 via a second via 172. That is, the second metal wire 182 may be formed on the second contact 132. The second metal wire 182 may be electrically connected to the second wordline 282 which will be described later in detail and may provide a second wordline signal to the second contact 132.

The first bitline 141 may be connected to the third contact 133 via a third via 173. That is, the first bitline 141 may be connected to the first active fin 111 via the first silicide 161, the third contact 133, and the third via 173. The first bitline 141 may be formed on the third contact 133.

The second bitline 142 may be connected to the fourth contact 134 via a fourth via 174. That is, the second bitline 142 may be connected to the second active fin 112 via the second silicide 162, the fourth contact 134, and the fourth via 174. The second bitline 142 may be formed on the fourth contact 134. The first and second bitlines 141 and 142 may be different paths for transmitting different signals.

The third metal wire 151 may be connected to the seventh contact 137 via a seventh via 177. That is, the third metal wire 151 may be connected to the fourth silicide 164 via the seventh via 177 and the seventh contact 137. The third metal wire 151 may be formed on the seventh contact 137. The third metal wire 151 may be connected to, for example, a ground voltage, but the present disclosure is not limited thereto.

The third metal wire 151 may be formed to extend between the first and second bitlines 141 and 142 in the first direction D1. The first and second bitlines 141 and 142 and the third metal wire 151 may be formed between, for example, the first and second contacts 131 and 132. In some example embodiments, no elements may be disposed between the first bitline 141 and the third metal wire 151 and between the third metal wire 151 and the second bitline 142.

According to some example embodiments of the present disclosure, by forming the first and second bitlines 141 and 142 and the third metal wire 151 between the first and second contacts 131 and 132, environmental differences between bitlines may be reduced. As a result, read current discrepancies may be reduced or minimized, thereby securing a design margin and improving the yield of a semiconductor device.

The fourth metal wire 152 may be connected to the eighth contact 138 via an eighth via 178. That is, the fourth metal wire 152 may be connected to the fourth active fin 114. The fourth metal wire 152 may be formed on the eighth contact 178. The fourth metal wire 152 may be connected to, for example, a reference voltage (or a power supply voltage). In other words, the fourth active fin 114 may be connected to, for example, the reference voltage.

The fifth metal wire 191 may connect the fifth and sixth contacts 135 and 136. For example, the fifth metal wire 191 may connect the fifth and sixth contacts 135 and 136 throughout the first and second regions "region I" and "region II" of the substrate 100. The fifth metal wire 191 may be formed on the fifth and sixth contacts 135 and 136.

Referring to FIG. 5, the fifth metal wire 191 may include a first portion 191-1, which includes a part 301 that overlaps with the fifth contact 135, a second portion 191-2, which includes a part 302 that overlaps with the sixth contact 136, and a third portion 191-3. The third portion 191-3 of the fifth metal wire 191 may directly contact an end of the first portion 191-1 and an end of the second portion 191-2.

The phrase "the third portion 191-3 of the fifth metal wire 191 may directly contact the end of the first portion 191-1 and the end of the second portion 191-2", as used herein, may mean that there are no intervening elements between the end of the first portion 191-1 and the third portion 191-3 and between the end of the second portion 191-2 and the third portion 191-3. For example, the fifth metal wire 191 may be a unitary member including the first, second, and third portions 191-1, 191-2, and 191-3.

The first and second portions 191-1 and 191-2 may extend in the first direction D1. The third portion 191-3 may extend in the second direction D2, directly contacting the end of the first portion 191-1 and the end of the second portion 191-2.

The fifth metal wire 191 is illustrated as being ⊏-shaped or U-shaped, but the present disclosure is not limited thereto. That is, the fifth metal wire 191 may be formed in various shapes other than a U shape or ⊏ shape, as long as it can connect the fifth and sixth contacts 135 and 136.

Referring again to FIGS. 2 through 4, the first wordline 281 may be electrically connected to the first metal wire 181 via a first wordline via 271. In other words, the first contact 131 may be electrically connected to the first wordline 281. The first wordline 281 may be formed on the first metal wire 181.

The second wordline 282 may be electrically connected to the second metal wire 182 via a second wordline via 272. In other words, the second contact 132 may be electrically connected to the second wordline 282. The second wordline 282 may be formed on the second metal wire 182.

The first and second wordlines 281 and 282 may both extend in the second direction D2. The first and second wordlines 281 and 282 may be spaced apart from each other in the first direction D1. The first and second wordlines 281 and 282 may be different paths for transmitting different wordline signals.

The relationships and the connections between the elements of a semiconductor device according to some example embodiments of the present disclosure will hereinafter be described with reference to FIGS. 6 through 8, which are cross-sectional views of some regions in a semiconductor device according to some example embodiments of the present disclosure. For convenience, the illustration of some elements such as a field insulating layer and a dielectric layer is omitted in FIGS. 6 through 8.

Referring to FIGS. 6 and 7, the first active fin 111 may be electrically connected to the first bitline 141 via the first silicide 161, the third contact 133, and the third via 173, which are formed on the first active fin 111.

The first silicide 161 may be connected to a semiconductor pattern 301, which is formed on the first active fin 111. As mentioned above, in some example embodiments, the first silicide 161 may be replaced by a contact that contacts both the semiconductor pattern 301 and the third contact 133.

In a case in which a transistor to be formed is a PMOS transistor, the semiconductor pattern 301 may comprise a compressive stress material. For example, the compressive stress material may be a material having a greater lattice constant than Si, such as SiGe. The compressive stress material applies compressive stress to the semiconductor pattern 301 and thus improves the mobility of carriers in a channel region.

In a case in which the transistor to be formed is an NMOS transistor, the semiconductor pattern 301 may comprise the same material as the substrate 100 or a tensile stress material. For example, in a case in which the substrate 100 comprises Si, the semiconductor pattern 301 may also comprise Si or may comprise a material having a smaller lattice constant than Si, such as SiC.

During an epitaxial process for forming the semiconductor pattern 301, the semiconductor pattern 301 may be doped in situ with impurities.

The semiconductor pattern 301 may be in at least one of a diamond shape, a circular shape, or a rectangular shape. The semiconductor pattern 301 is illustrated as being in a diamond shape (or a pentagon or hexagon shape), but the present disclosure is not limited thereto.

The third contact 133 may be formed on the first silicide 161. The first bitline 141 may be formed on the third contact 133. The third via 173 may be formed on the third contact 133 to connect the third contact 133 and the first bitline 141. That is, the third via 173 may be formed between the third contact 133 and the first bitline 141.

The first silicide 161, the third contact 133, the third via 173, and the first bitline 141 may overlap with one another in the third direction D3.

The sidewalls of the third contact 133 are illustrated as, but are not limited to, having a slope with respect to the substrate 100, and the sidewalls of the third via 173 are illustrated as, but are not limited to, being perpendicular to the substrate 100. For example, the sidewalls of the third contact 133 and the sidewalls of the third via 173 may form various angles with the substrate 100.

Referring to FIGS. 6 and 8, the first contact 131 may be formed on the first gate electrode 121. The first metal wire 181 may be formed on the first contact 131. The first contact 131 and the first metal wire 181 may be connected by the first via 171. In other words, the first metal wire 181 and the first gate electrode 121 may be electrically connected by the first via 171.

The first bitline 141, the third metal wire 151, and the second bitline 142 may be formed at a location higher than the first and second gate electrodes 121 and 122 with respect to the top surface of the substrate 100.

The second contact 132 may be formed on the second gate electrode 122. The second metal wire 182 may be formed on the second contact 132. The second contact 132 and the second metal wire 182 may be connected by the second via 172. In other words, the second metal wire 182 and the second gate electrode 122 may be electrically connected by the second via 172.

An interlayer dielectric layer 311 may be formed between the first gate electrode 121 and the second gate electrode 122 and between the first contact 131 and the second contact 132. The interlayer dielectric layer may also be formed in the spaces among the first metal wire 181, the first bitline 141, the third metal wire 151, the second bitline 142, and the second metal wire 182. The interlayer dielectric layer may also be formed between a layer in which the first and second contacts 131 and 132 are formed and a layer in which the first metal wire 181 is formed.

The interlayer dielectric layer may comprise, for example, at least one of a low-k material, an oxide layer, a nitride layer, or an oxynitride layer. The low-k material may be, for example, Flowable OXide (FOX), Tonen SilaZene (TOSZ), Undoped Silicate Glass (USG), BoroSilicate Glass (BSG), PhosphoSilicate Glass (PSG), BoroPhosphoSilicate Glass (BPSG), Plasma Enhanced Tetra Ethyl Ortho Silicate (PE-TEOS), Fluoride Silicate Glass (FSG), High Density Plasma (HDP), Plasma Enhanced OXide (PEOX), Flowable Chemical Vapor Deposition (FCVD), or a combination thereof, but the present disclosure is not limited thereto.

A semiconductor device according to some example embodiments of the present disclosure will hereinafter be described with reference to FIGS. 2 and 9 through 11. For clarity, detailed descriptions of elements that have already been described above will be omitted.

Figure 9:
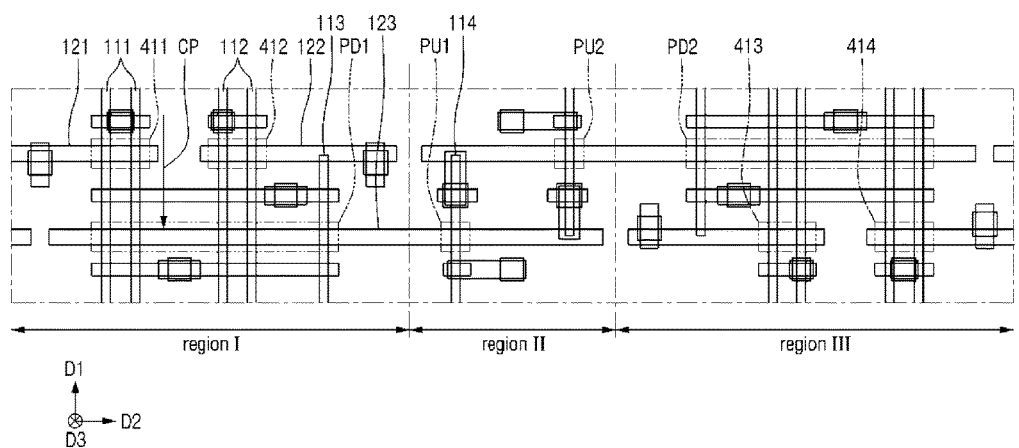
FIG. 9 is a layout view of a semiconductor device according to some example embodiments of the present disclosure.
Figure 10:
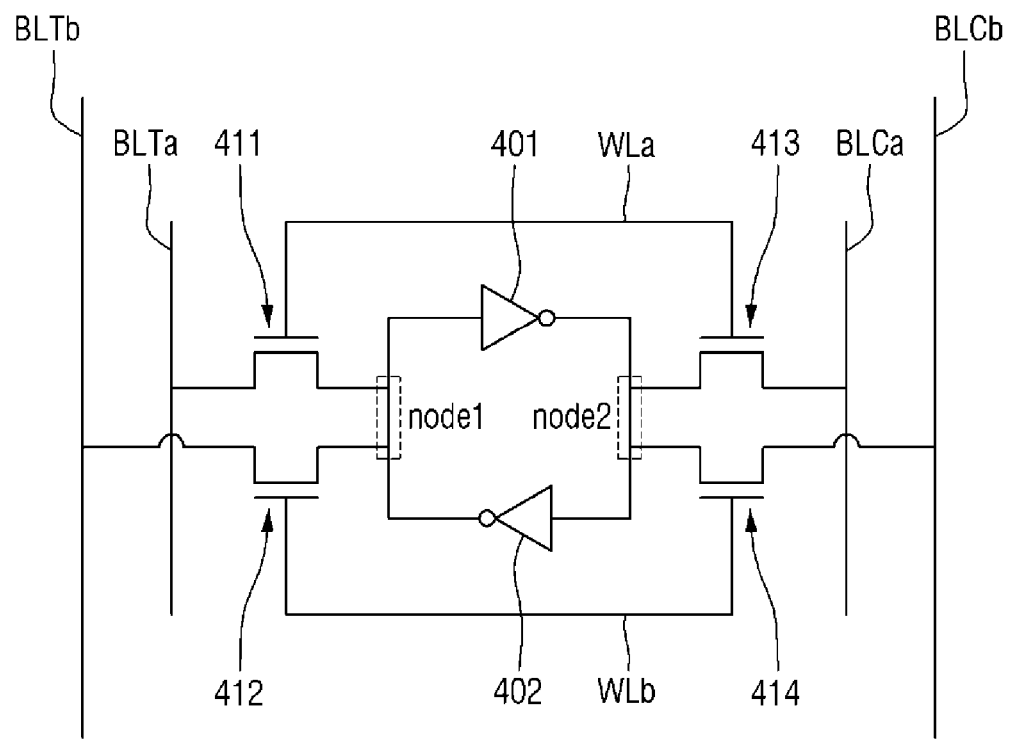
FIGS. 10 and 11 are circuit diagrams of the semiconductor devices of FIGS. 2 and 9, respectively.
Figure 11:
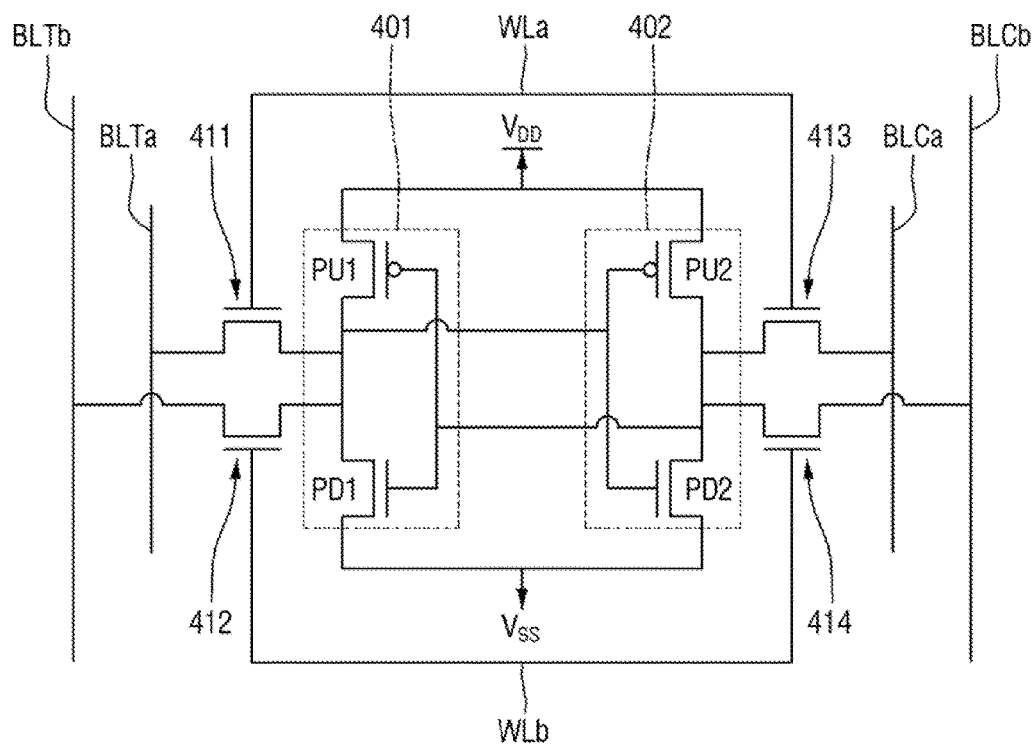

FIG. 9 is a layout view of a semiconductor device according to some example embodiments of the present disclosure. FIGS. 10 and 11 are circuit diagrams of the semiconductor devices of FIGS. 2 and 9, respectively. For clarity, the illustration of wordlines WLa and WLb and bitlines BLTa, BLCa, BLTb, and BLCb of FIGS. 10 and 11 is omitted in FIG. 9.

Referring to FIGS. 2 and 9 through 11, a first transistor 411 may be formed at the intersection between a first gate electrode 121 and a first active fin 111. That is, the first transistor 411 may be formed on the first active fin 111.

The first transistor 411 may be gated by a first wordline signal, which is provided to the first wordline WLa. The first wordline WLa may be the first wordline 281 of FIG. 2. The first transistor 411 may provide a first bitline signal, which is provided to the first bitline BLTa, to a first inverter 401. The first bitline BLTa may be the first bitline 141 of FIG. 2.

A second transistor 412 may be formed at the intersection between a second gate electrode 122 and a second active fin 112. That is, the second transistor 412 may be formed on the second active fin 112.

The second transistor 412 may be gated by a second wordline signal, which is provided by the second wordline WLb. The second wordline WLb may be the second wordline 282 of FIG. 2. The second transistor 412 may provide a second bitline signal, which is provided to the second bitline BLTb, to the first inverter 401. The second bitline BLTb may be the second bitline 142 of FIG. 2.

The first and second wordline signals may include complementary signals.

One side of the first transistor 411 may be connected to the first bitline BLTa (or 141) via a third contact 133. The other side of the first transistor 411 may be connected to a first node "node1". The gate of the first transistor 411 may be connected to the first wordline WLa (or 281) via the first contact 131.

One side of the second transistor 412 may be connected to the second bitline BLTb (or 142) via a fourth contact 134. The other side of the second transistor 412 may be connected to the first node "node1". The gate of the second transistor 412 may be connected to the second wordline WLb (or 282) via a second contact 132.

In other words, the other sides of the first and second transistors 411 and 412 may be connected by a third silicide 163. The one sides of the first and second transistors 411 and 412 may be, but are not limited to, drains, and the other sides of the first and second transistors 411 and 412 may be, but are not limited to, sources.

In some example embodiments, the first and second transistors 411 and 412 may serve as pass gates.

A one side of the third transistor 413 may be connected to the third bitline BLCa, and the other side of the third transistor 413 may be connected to a second node "node2". The third transistor 413 may be gated by the first wordline signal, which is provided to the first wordline WLa (or 281). The third transistor 413 may provide a third bitline signal, which is provided to the third bitline BLCa, to a second inverter 402.

One side of the fourth transistor 414 may be connected to the fourth bitline BLCb, and the other side of the fourth transistor 414 may be connected to the second node "node2". The fourth transistor 414 may be gated by the second wordline signal, which is provided to the second wordline WLb (or 282). The fourth transistor 414 may provide a fourth bitline signal, which is provided to the fourth bitline BLCb, to the second inverter 402.

The first and third bitline signals may include complementary signals. The second and fourth bitline signals may include complementary signals. The first and second bitline signals may include complementary signals.

The first and second inverters 401 and 402 may be connected in series. To form a single latch circuit, the input node of the first inverter 401 may be connected to the output node of the second inverter 402, and the input node of the second inverter 402 may be connected to the output node of the first inverter 401.

In other words, the input of the first inverter 401 and the output of the second inverter 402 may be connected to the first node "node1", and the output of the first inverter 401 and the input of the second inverter 402 may be connected to the second node "node2". The first and second inverters 401 and 402 may form a single SRAM cell together.

The first inverter 401 may include a first pull-up transistor PU1 and a first pull-down transistor PD1, which are connected in series. The second inverter 402 may include a second pull-up transistor PU2 and a second pull-down transistor PD2, which are connected in series.

The first and second pull-up transistors PU1 and PU2 may be p-channel field-effect transistors (PFETs), and the first and second pull-down transistors PD1 and PD2 may be n-type field-effect transistors (NFETs).

One side of the first pull-up transistor PU1 may be connected to a fourth metal wire 152. For example, the one side of the first pull-up transistor PU1 may be connected to a reference voltage. The other side of the first pull-up transistor PU1 may be connected to one side of the first pull-down transistor PD1 via a fifth metal wire 191. The other side of the first pull-down transistor PD1 may be connected to a third metal wire 151. For example, the other side of the first pull-down transistor PD1 may be connected to a ground voltage.

The other side of the first pull-up transistor PU1 and the one side of the first pull-down transistor PD1 may be connected to the other side of the first transistor 411 and the other side of the second transistor 412 via the third silicide 163.

The gates of the first pull-up and pull-down transistors PU1 and PD1 may be connected by a third gate electrode 123.

According to some example embodiments of the present disclosure, data stored in an SRAM device can be accessed via two ports (for example, a double port). By selecting the first wordline WLa and the first and third bitlines BLTa and BLCa, data can be written to, or read from, the latch circuit formed by the first and second inverters 401 and 402. That is, a path defined by the first wordline WLa and the first and third bitlines BLTa and BLCa may be used as a first port. By selecting the second wordline WLb and the second and fourth bitlines BLTb and BLCb, data can be read from the latch circuit formed by the first and second inverters 401 and 402. That is, a path defined by the second wordline WLb and the second and fourth bitlines BLTb and BLCb may be used as a second port.

In this type of SRAM device, a read operation via the second port can be performed independently of an operation performed via the first port, thereby causing no influence on data stored in a latch circuit. In other words, an operation of reading data from a latch circuit and an operation of writing data to the latch circuit can be performed independently of each other.

According to some example embodiments of the present disclosure, the first through third active fins 111 through 113 are disposed between the first and second contacts 131 and 132, and the fifth and sixth contacts 135 and 136 are connected to the fifth metal wire 191, thereby considerably reducing read current discrepancies.

More specifically, in a case in which during a read operation, the first transistor 411, the third transistor 413, and the first pull-down transistor PD1 in the first region "region I" are high, a read current may flow to the third metal wire 151 via a read current path CP. The read current path CP may include a path along which a current flows from the first bitline 141 to the third metal wire 151 via the first transistor 411, the third silicide 163, and the first pull-down transistor PD1.

In a case in which during a read operation, the first transistor 411, the third transistor 413, and the second pull-down transistor PD2 in the third region "region III" are high, a read current may flow from the third bitline BLCa to "Vss" via the third transistor 413 and the second pull-down transistor PD2.

That is, according to some embodiments of the preset disclosure, during a read operation, a read current may not flow to a gate electrode with high resistance. Also, since a read current of transistors connected by the same wordline (for example, the first and third transistors 411 and 413 connected by the first wordline WLa) does not pass through any gate electrode, current discrepancies can be considerably reduced.

A method of fabricating a semiconductor device according to some example embodiments of the present disclosure will hereinafter be described with reference to FIGS. 2 and 12 through 17. For clarity, detailed descriptions of elements that have already been described above will be omitted.

FIGS. 12 through 17 are schematic views illustrating steps of a method of fabricating a semiconductor device according to some example embodiments of the present disclosure.

Figure 12:
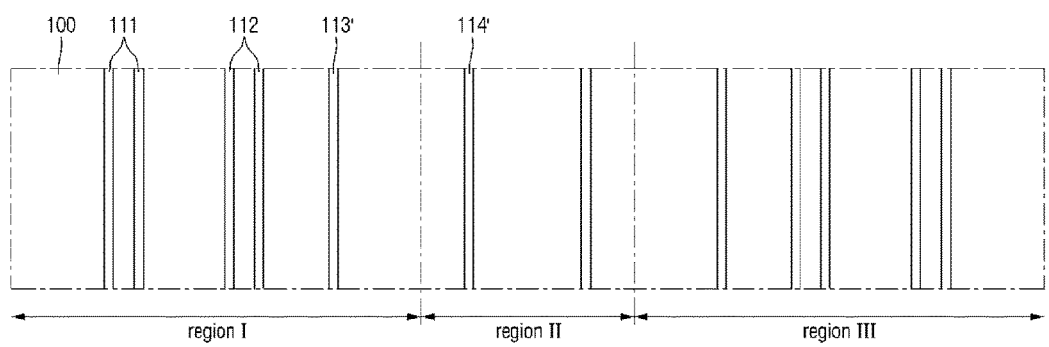
FIGS. 12 through 17 are schematic views illustrating steps of a method of fabricating a semiconductor device according to some example embodiments of the present disclosure.

Referring to FIG. 12, a first active fin 111, a second active fin 112, a third active fin 113', and a fourth active fin 114' may be formed on a substrate 100 to be spaced apart from one another.

The first active fin 111, the second active fin 112, the third active fin 113', and the fourth active fin 114' may be formed using an epitaxial layer formed on a base substrate. The epitaxial layer may comprise Si or Ge, which is an element semiconductor material. Alternatively, the epitaxial layer may comprise a compound semiconductor, for example, a IV-IV group compound semiconductor or a III-V group compound semiconductor.

More specifically, the IV-IV group compound semiconductor may be, for example, a binary or ternary compound comprising at least two of C, Si, Ge, and/or Sn, or a compound obtained by doping the binary or ternary compound with a IV group element. The III-V group compound semiconductor may be, for example, a binary, ternary, or quaternary compound obtained by combining at least one III group element such as Al, Ga, or In, and a V group element such as P, As, or Sb.

Figure 13:
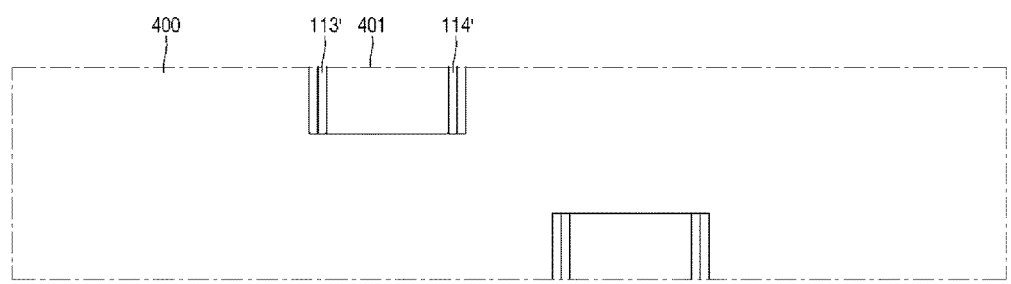

Referring to FIG. 13, a mask pattern 400 including an opening 401 may be formed on the substrate 100. The mask pattern 400 may be formed to completely cover the first and second active fins 111 and 112. On the other hand, due to the opening 401 of the mask pattern 400, parts of the third and fourth active fins 113' and 114' may be exposed. The mask pattern 400 may further include another openings as necessary.

Figure 14:
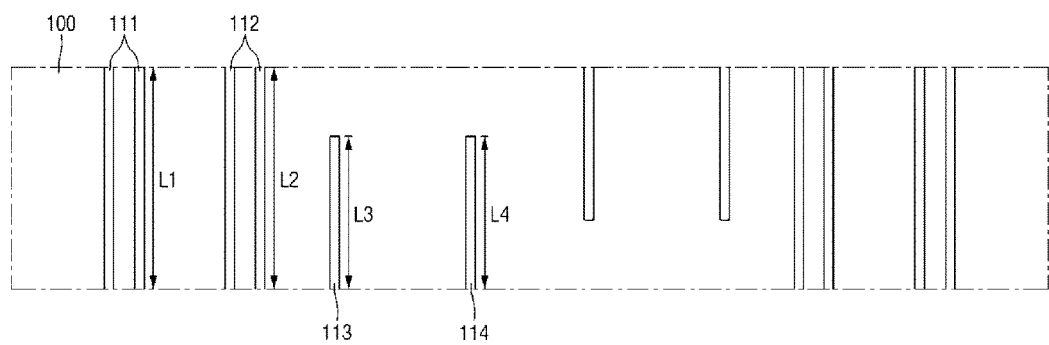

Referring to FIG. 14, the exposed parts of the third and fourth active fins 113' and 114' by the opening 401 of the mask pattern 400 may be etched, and as a result, third and fourth active fins 113 and 114 may be formed.

A length L1 of the first active fin 111 and a length L2 of the second active fin 112 may differ from a length L3 of the third active fin 113 and a length L4 of the fourth active fin 114. For example, the length L1 of the first active fin 111 and the length L2 of the second active fin 112 may be larger than the length L3 of the third active fin 113 and the length L4 of the fourth active fin 114.

In some example embodiments, since the third and fourth active fins 113 and 114 are obtained by etching the third and fourth active fins 113' and 114' using the same opening 401 of the mask pattern 400, the length L3 of the third active fin 113 may be the same as the length L4 of the fourth active fin 114. The lengths L1 through L4 may be the lengths of the first through fourth active fins 111 through 114 in a direction in which the first through fourth active fins 111 through 114 extend.

After the formation of the third and fourth active fins 113 and 114, the mask pattern 400 may be removed.

Figure 15:
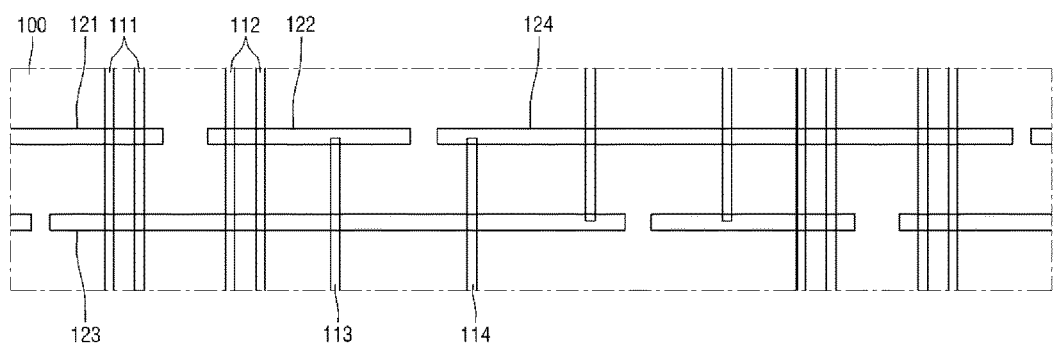

Referring to FIG. 15, first through fourth gate electrodes 121 through 124 may be formed. The first through fourth gate electrodes 121 through 124 may be formed by a gate-first or gate-last process. For clarity, the illustration of some elements such as gate spacers and a gate insulating layer is omitted in FIG. 15.

Figure 16:
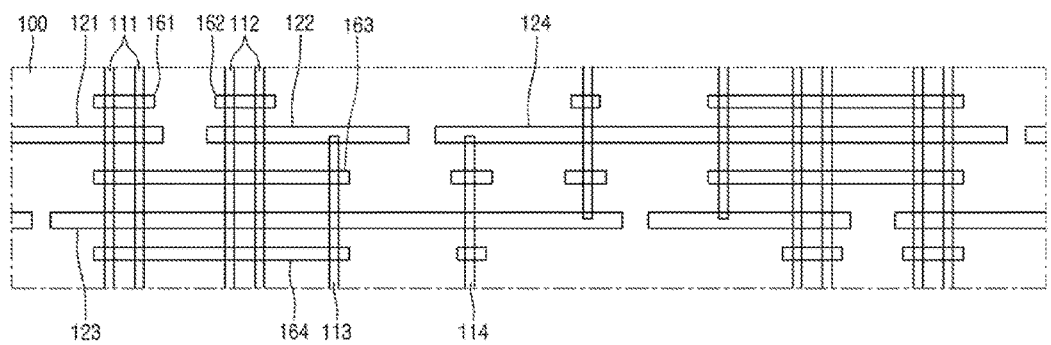

Referring to FIG. 16, first through fourth silicides 161 through 164 may be formed to connect the source/drain regions of each of the first through fourth active fins 111 through 114.

Figure 17:
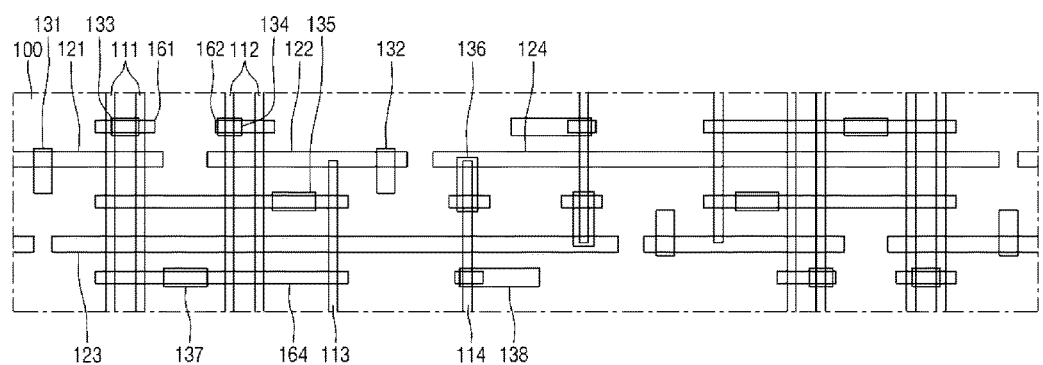

Referring to FIG. 17, contacts 131 through 138 may be formed on the first through fourth silicides 161 through 164 and the first and second gate electrodes 121 and 122.

Referring again to FIG. 2, vias and metal wires, which are connected to the contacts 131 through 138, may be formed.

A semiconductor device according to some example embodiments of the present disclosure will hereinafter be described with reference to FIG. 18. For clarity, detailed descriptions of elements that have already been described above will be omitted.

Figure 18:
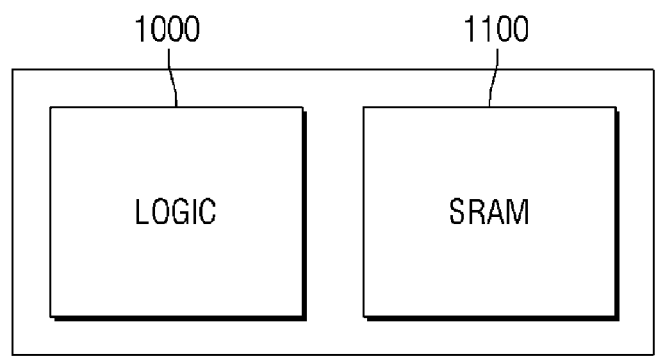
FIG. 18 is a conceptual view of a semiconductor device according to some example embodiments of the present disclosure.

FIG. 18 is a conceptual view of a semiconductor device according to some example embodiments of the present disclosure.

Referring to FIG. 18, a semiconductor device according to some example embodiments of the present disclosure may include a logic region 1000 and an SRAM region 1100. In the logic region 1000, logic devices necessary for the operation of a semiconductor device according to some example embodiments of the present disclosure are formed, and in the SRAM region 1100, an SRAM device may be formed.

In some example embodiments, a semiconductor device according to some example embodiments of the present disclosure may be disposed in the SRAM region 1100.

FIG. 18 illustrates the logic region 1000 and the SRAM region 1100, but the present disclosure is not limited thereto. That is, the present disclosure is also applicable to the logic region 1000 and a memory region in which a memory other than an SRAM, such as, for example, a dynamic random access memory (DRAM), a magnetic random access memory (MRAM), a resistive random access memory (RRAM), or a phase-change random access memory (PRAM), is formed.

The terminology used herein is for the purpose of describing particular embodiments only and is not intended to be limiting of example embodiments. It will be understood that when an element is referred to as being "on" or "connected to" or "adjacent" another element (e.g., a layer or substrate), it can be directly on or connected to or adjacent the other element, or intervening elements may also be present. In contrast, when an element is referred to as being "directly on" or "directly connected to" or "immediately adjacent" another element, there are no intervening elements present.

It will also be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar references herein are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "and/or" includes any and all combinations of one or more of the associated listed items.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concepts.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device, comprising:
    a substrate;
    first, second, third, and fourth active fins on the substrate, extending in a first direction, and spaced apart from one another in a second direction, which intersects the first direction;
    a first gate electrode extending in the second direction and on the first active fin to overlap with the first active fin, but not with the second through fourth active fins;
    a second gate electrode extending in the second direction and on the second and third active fins to overlap with the second and third active fins, but not with the first and fourth active fins;
    a third gate electrode extending in the second direction and on the first through fourth active fins, spaced apart from the first and second gate electrodes in the first direction, to overlap with the first through fourth active fins;
    a first contact on the first gate electrode and connected to a first wordline; and
    a second contact on the second gate electrode and connected to a second wordline,
    wherein the third active fin is between the first and second active fins and the fourth active fin,
    a length of the first and second active fins in the first direction is larger than a length of the third and fourth active fins in the first direction, and
    the first, second, and third active fins are between the first and second contacts.

2. The semiconductor device of claim 1, wherein the length of the third active fin in the first direction is the same as the length of the fourth active fin in the first direction.

3. The semiconductor device of claim 1, further comprising:
    a third contact on the first active fin and connected to a first bitline; and
    a fourth contact on the second active fin and connected to a second bitline, which is different from the first bitline.

4. The semiconductor device of claim 3, wherein
    the first bitline is on the third contact to extend in the first direction,
    the second bitline is on the fourth contact to extend in the first direction, and
    the semiconductor device further comprises a first metal wire, which extends between the first and second bitlines in the first direction and is connected to a ground voltage.

5. The semiconductor device of claim 4, wherein the first and second bitlines and the first metal wire are between the first and second contacts.

6. The semiconductor device of claim 4, wherein the fourth active fin is connected to a reference voltage.

7. The semiconductor device of claim 1, further comprising:
    a first silicide connected to the first bitline and formed between the first active fin and the third contact; and
    a second silicide connected to the second bitline and formed between the second active fin and the fourth contact.

8. The semiconductor device of claim 1, further comprising:
    a third silicide on the first through third active fins to extend in the second direction;
    a fifth contact on the third silicide; and
    a sixth contact on the fourth active fin and connected to the fifth contact.

9. The semiconductor device of claim 8, further comprising:
    a second metal wire on the fifth and sixth contacts and connecting the fifth and sixth contacts,
    wherein the second metal wire includes a first portion, which includes a part that overlaps with the fifth contact and extends in the first direction, a second portion, which includes a part that overlaps with the sixth contact and extend in the first direction, and a third portion, which contacts ends of the first and second portions and extends in the second direction.

10. The semiconductor device of claim 1, wherein
    the substrate includes first and second regions, which are adjacent to each other,
    the first through third active fins are in the first region, and
    the fourth active fin is in the second region.

11. The semiconductor device of claim 1, wherein the first and second contacts extend in the first direction.

12. A semiconductor device, comprising:
    a substrate;

first, second, third, and fourth active fins on the substrate, extending in a first direction, and spaced apart from one another in a second direction, which intersects the first direction;

a first gate electrode extending in the second direction and on the first active fin to overlap with the first active fin, but not with the second through fourth active fins;

a second gate electrode extending in the second direction and on the second and third active fins to overlap with the second active fin, but not with the first and fourth active fins;

a first contact on the first gate electrode and connected to a first wordline; and a second contact on the second gate electrode and connected to a second wordline, wherein the first, second, and third active fins are between the first and second contacts.

13. The semiconductor device of claim 12, wherein
the third active fin is between the first and second active fin and the fourth active fin, and a length of the first and second active fins in the first direction is larger than a length of the third and fourth active fins in the first direction.

14. The semiconductor device of claim 13, wherein the length of the third active fin in the first direction is the same as the length of the fourth active fin in the first direction.

15. The semiconductor device of claim 12, further comprising:

a third contact on the first active fin;

a fourth contact on the second active fin;

a first bitline on the third contact, connected to the third contact, and extending in the first direction;

a second bitline on the fourth contact, connected to the fourth contact, and extending in the first direction; and a first metal wire extending between the first and second bitlines in the first direction and connected to a ground voltage, wherein the first and second bitlines and the first metal wire are between the first and second contacts.

16. An integrated circuit device, comprising:

a substrate comprising adjacent first and second substrate regions;

active fins protruding from the substrate in the first and second substrate regions and extending parallel to one another in a first direction;

first and second gate electrodes extending co-linearly in a second direction that intersects the first direction, wherein the first and second gate electrodes are electrically isolated and extend on first and second active fins of the active fins in the first substrate region to define first and second transistors, respectively;

first and second wordlines extending in parallel on the first and second substrate regions; and first and second wordline contacts connecting the first and second gate electrodes to the first and second wordlines, respectively, wherein the first and second transistors in the first substrate region are between the first and second wordline contacts.

17. The integrated circuit device of claim 16, further comprising:

first and second metal wires connecting the first and second wordline contacts to the first and second wordlines, respectively; and a third metal wire extending in the first direction between the first and second wordline contacts, wherein the third metal wire is connected to a ground voltage.

18. The integrated circuit device of claim 17, further comprising:

first and second bitlines extending in parallel in the first direction on opposite sides of the third metal wire, wherein the first and second bitlines and the third metal wire therebetween are between the first and second wordline contacts; and first and second bitline contacts connecting the first and second bitlines to the first and second active fins, respectively.

19. The integrated circuit device of claim 18, wherein the active fins in the first substrate region further comprise a third active fin having a shorter length than the first and second active fins, and further comprising:

a third gate electrode extending parallel to the first and second gate electrodes in the section direction and on the first, second, third active fins; and a silicide layer extending in the second direction between the third gate electrode and the first and second gate electrodes, and connecting the first, second, and third active fins, wherein, responsive to signals applied to the first and second gate electrodes by the first and second wordlines, the first and second transistors are operable to connect the first and second bitlines to the silicide layer, respectively, and wherein a signal applied to the third gate electrode is operable to connect the silicide layer to the third metal wire.

20. The integrated circuit device of claim 19, wherein the active fins in the second substrate region comprise a fourth active fin having a shorter length than the first and second active fins, wherein the third gate electrode further extends on the fourth active fin, and further comprising:

a fourth metal wire connecting the fourth active fin to a reference voltage; and a fifth metal wire extending in the second direction from the first substrate region to the second substrate region and connecting the silicide layer to the fourth active fin, wherein a signal applied to the third gate electrode is operable to connect the silicide layer to the fourth metal wire.

* * * * *